(12) United States Patent
Peidous et al.

(10) Patent No.: US 7,462,524 B1
(45) Date of Patent: Dec. 9, 2008

(54) METHODS FOR FABRICATING A STRESSED MOS DEVICE

(75) Inventors: Igor Peidous, Fishkill, NY (US); Martin Gerhardt, Dresden (DE); David E. Brown, Pleasant Valley, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 385 days.

(21) Appl. No.: 11/205,797

(22) Filed: Aug. 16, 2005

(51) Int. Cl.
*H01L 21/336* (2006.01)

(52) U.S. Cl. .................. 438/197; 438/300; 438/592

(58) Field of Classification Search ................ 438/197, 438/300, 301, 303, 305, 592
See application file for complete search history.

(56) References Cited

U.S. PATENT DOCUMENTS

| | | | | |
|---|---|---|---|---|
| 6,124,189 A | * | 9/2000 | Watanabe et al. | 438/586 |
| 6,406,973 B1 | * | 6/2002 | Lee | 438/416 |
| 7,238,580 B2 | * | 7/2007 | Orlowski et al. | 438/300 |
| 7,265,400 B2 | * | 9/2007 | Matsuda | 257/288 |

* cited by examiner

*Primary Examiner*—Michael Trinh
(74) *Attorney, Agent, or Firm*—Ingrassia Fisher & Lorenz, P.C.

(57) ABSTRACT

Methods are provided for fabricating a stressed MOS device. One method comprises the steps of providing a substrate of a monocrystalline semiconductor material having a first lattice constant, and forming a conductive gate electrode overlying the substrate, the gate electrode having opposing sides and having a thickness. Sidewall spacers are formed on the opposing sides of the gate electrode and trenches are etched in the semiconductor substrate in alignment with the sidewall spacers. A portion of the thickness of the conductive gate electrode is also etched to leave a remaining portion of the conductive gate electrode. A stress inducing layer of material is grown on the remaining portion of the conductive gate electrode and filling the trenches, the stress inducing layer of material having a second lattice constant different than the first lattice constant.

7 Claims, 3 Drawing Sheets

US 7,462,524 B1

METHODS FOR FABRICATING A STRESSED MOS DEVICE

TECHNICAL FIELD OF THE INVENTION

The present invention generally relates methods for fabricating stressed MOS devices, and more particularly relates to methods for increasing the mobility of majority carriers in both P-channel MOS transistors and N-channel MOS transistors.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes.

MOS transistors, in contrast to bipolar transistor, are majority carrier devices. The gain of an MOS transistor, usually defined by the transconductance ($g_m$), is proportional to the mobility of the majority carrier in the transistor channel. The current carrying capability and hence the performance of an MOS transistor is proportional to the mobility of the majority carrier in the channel. The mobility of holes, the majority carrier in a P-channel MOS transistor can be increased by applying a compressive longitudinal stress to the channel. The mobility of electrons, the majority carrier in an N-channel MOS transistor, however, is decreased by such a compressive longitudinal stress to the channel. To increase the mobility of electrons, a tensile transverse stress must be applied to the channel of the MOS transistor.

Accordingly, it is desirable to provide methods for fabricating MOS transistors that improves the mobility of both P-channel and N-channel MOS transistors. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

Methods are provided for fabricating a stressed MOS device. A method in accordance with one embodiment of the invention comprises the steps of providing a substrate of a monocrystalline semiconductor material having a first lattice constant, and forming a conductive gate electrode overlying the substrate, the gate electrode having opposing sides and having a thickness. Sidewall spacers are formed on the opposing sides of the gate electrode and trenches are etched in the semiconductor substrate in alignment with the sidewall spacers. A portion of the thickness of the conductive gate electrode is also etched to leave a remaining portion of the conductive gate electrode. A stress inducing layer of material is grown on the remaining portion of the conductive gate electrode and filling the trenches, the stress inducing layer of material having a second lattice constant different than the first lattice constant.

BRIEF DESCRIPTION OF THE DRAWINGS

The present invention will hereinafter be described in conjunction with the following drawing figures, wherein like numerals denote like elements, and wherein FIGS. 1, 3, and 5-7 illustrate the device in cross section while FIGS. 2, 4, and 8 illustrate the device in top view.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-8 illustrate a stressed MOS device 30 and method steps for manufacturing such an MOS device in accordance with various embodiments of the invention. In this illustrative embodiment stressed MOS device 30 is illustrated by a single MOS transistor. Because the benefits to be achieved by the methods in accordance with the invention are applicable to both P-channel and N-channel MOS transistors, it is not necessary to distinguish N-channel or P-channel in this illustrative embodiment. Those of skill in the art will know that MOS transistors of one type or the other can be fabricated by appropriate choices of impurity doping type. An integrated circuit formed from stressed MOS devices such as device 30 can include a large number of such transistors, and may include both stressed and unstressed P-channel MOS transistors and stressed and unstressed N-channel transistors.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
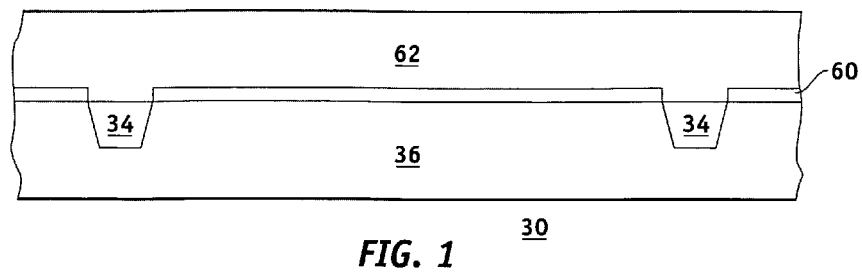
FIGS. 1-8 illustrate a stressed MOS device and methods for its fabrication in accordance with various embodiments of the invention.
Figure 2:
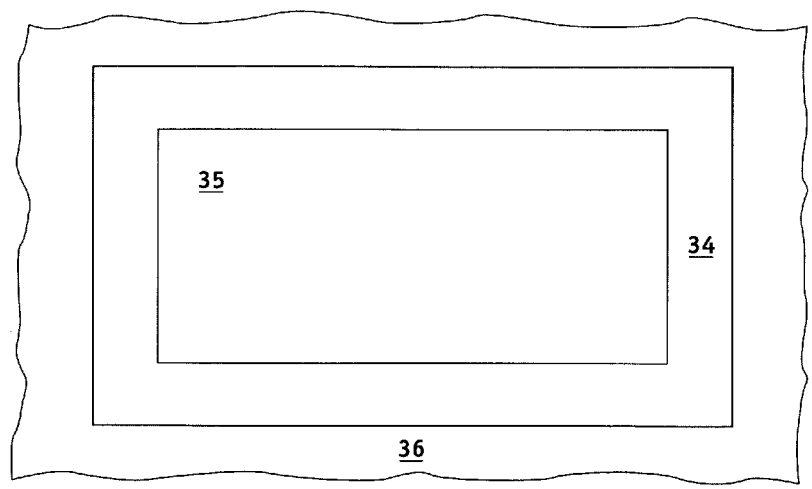

As illustrated in FIG. 1, the manufacture of stressed MOS device 30, in accordance with an embodiment of the invention, begins with providing a semiconductor substrate 36. The semiconductor substrate can be any monocrystalline semiconductor material, but is preferably a monocrystalline silicon substrate wherein the term "silicon substrate" is used herein to encompass the relatively pure silicon materials typically used in the semiconductor industry. Semiconductor substrate 36 will herein be referred to, for ease of discussion but without limitation, alternatively as a silicon substrate or as a semiconductor substrate. Whether formed of monocrystalline silicon or some other monocrystalline semiconductor material, the monocrystalline material forming substrate 36 will be characterized by a lattice constant associated with the crystalline structure of that material. Silicon substrate 36 may be a bulk silicon wafer or a thin layer of silicon on an insulating layer (commonly know as silicon-on-insulator or SOI) that, in turn, is supported by a silicon carrier wafer, but is here illustrated, without limitation, as a bulk silicon wafer. Preferably the silicon wafer has a [100] orientation. Although not illustrated, portions of substrate 36 will be doped with N-type impurity dopants (an N-well) for the fabrication of P-channel MOS transistors and other portions will be doped with P-type impurity dopants (a P-well) for the fabrication of N-channel MOS transistors. The N-well and P-well can be doped to the appropriate conductivity, for example, by ion implantation. Shallow trench isolation (STI) 34 or other form of electrical isolation is formed in the semiconductor substrate and preferably at the surface of the semiconductor substrate to electrically isolate individual devices as required by the circuit function being implemented. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material the surface is usually planarized, for example by chemical mechanical planarization (CMP). In this exemplary embodiment, as illustrated in top view in FIG. 2, the STI is merely shown as a rectangular "window frame" of insulating material that surrounds an active area 35 of silicon substrate 36.

With reference again to FIG. 1, a layer of gate insulator 60 is formed on the surface of silicon substrate 36. The gate insulator may be a thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). The gate insulator material is typically 1-10 nanometers (nm) in thickness. In accordance with one embodiment of the invention a layer of polycrystalline silicon 62 is deposited onto the layer of gate insulator. The layer of polycrystalline silicon is preferably deposited as undoped polycrystalline silicon and is subsequently impurity doped by ion implantation. The polycrystalline material can be deposited, for example, to a thickness of about 110 nm by LPCVD by the hydrogen reduction of silane.

Figure 3:
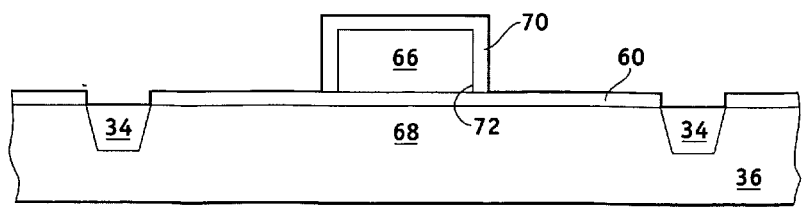
Figure 4:
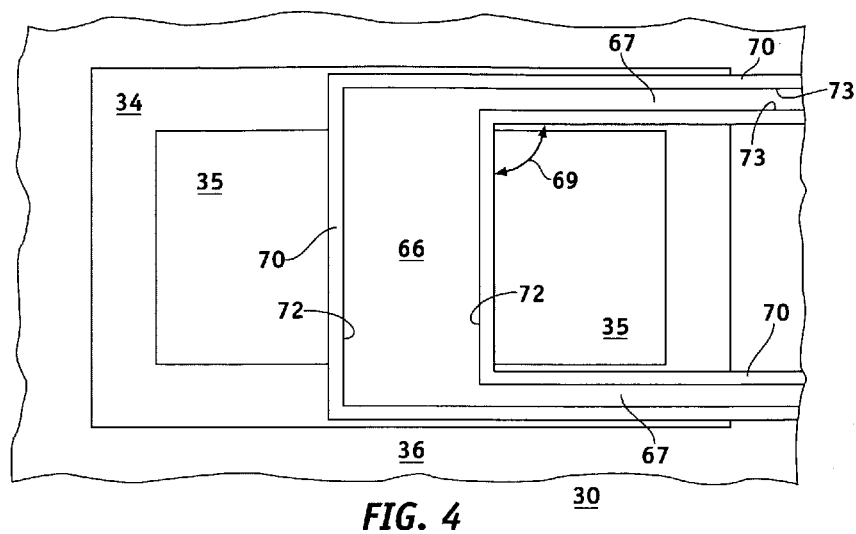

The layer of polycrystalline silicon 62 is photolithographically patterned to form an MOS transistor gate electrode 66 as illustrated in FIG. 3. Gate electrode 66 overlies the portion of active area 35 of semiconductor substrate 36 that will form channel 68 of MOS transistor 30. In accordance with an embodiment of the invention, polycrystalline silicon layer 62 is also patterned to form a polycrystalline silicon gate electrode extension 67 that extends angularly from gate electrode 66. For reasons that will be explained more fully below, the polycrystalline silicon gate electrode extension forms an angle 69 with gate electrode 66. Angle 69 is preferably between about 45° and about 135°, and most preferably is about 90°. Polycrystalline silicon gate electrode extension 67 is positioned overlying shallow trench isolation 34 as is illustrated in top view in FIG. 4. The polycrystalline silicon can be etched in the desired pattern by, for example, plasma etching in a Cl or HBr/$O_2$ chemistry. Although in this illustrative embodiment gate electrode extensions are shown at each end of the gate electrode, it may also be advantageous, in accordance with a further embodiment of the invention, to terminate the gate electrode at the edge of the active area. Whether the gate electrode extensions are formed on both ends of the gate electrode or not may be determined, in part, by the need to use the extensions for interconnecting gate electrode 66 with the gate electrodes of other transistors of the integrated circuit. Following the patterning of the gate electrode, in accordance with one embodiment of the invention, a thin layer 70 of silicon oxide is thermally grown on the opposing sidewalls 72 of gate electrode 66 and on opposing sidewalls 73 of polycrystalline silicon gate electrode extension 67 by heating the polycrystalline silicon in an oxidizing ambient. Layer 70 can be grown to a thickness of about 2-5 nm. Gate electrode 66 and layer 70 can be used as an ion implant mask to form source and drain extensions (not illustrated) of the MOS transistor. The possible need for and method of forming multiple source and drain regions are well known, but are not germane to this invention and hence need not be explained herein.

Figure 5:
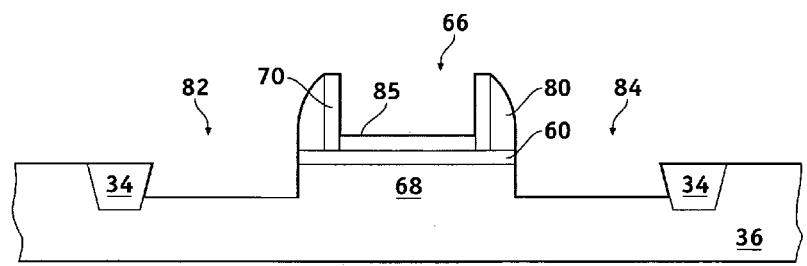

As illustrated in FIG. 5, sidewall spacers 80 are formed on the opposing sidewalls 72 of gate electrode 66 and sidewall spacers 81 (not shown in FIG. 5) are formed on the opposing sidewalls 73 of polycrystalline silicon gate electrode extensions 67. The sidewall spacers can be formed of silicon nitride, silicon oxide, or the like by depositing a layer of the spacer material over the gate electrodes and subsequently anisotropically etching the layer, for example by reactive ion etching. In accordance with one embodiment of the invention sidewall spacers 80 are used as an etch mask to etch trenches 82 and 84 in the silicon substrate in spaced apart self alignment with MOS transistor gate electrode 66. The trenches intersect the ends of channel 68. The trenches can be etched, for example, by plasma etching using a Cl or HBr/$O_2$ chemistry. Preferably each of the trenches has a depth or about 0.04-0.1 μm. In accordance with an embodiment of the invention, at the same time that trenches 82 and 84 are being etched in silicon substrate 36, the same etchant can be used to etch the polycrystalline silicon that forms gate electrode 66 and gate electrode extension 67. The etching is terminated before all of the polycrystalline silicon is etched, leaving a thinned, unetched portion 85 of the polycrystalline silicon gate electrode and a thinned, unetched portion (not illustrated in FIG. 5) of the polycrystalline silicon gate electrode extension.

Figure 6:
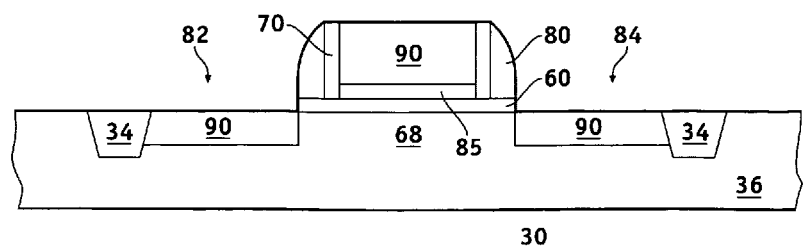

As illustrated in FIG. 6, trenches 82 and 84 are filled with a layer of stress inducing material 90. The stress inducing material can be any monocrystalline material that can be grown on the silicon substrate with a different lattice constant than the lattice constant of silicon. The difference in lattice constant of the two juxtaposed materials generates a stress at the interface that is then redistributed in the host material. Preferably the stress inducing material causes the silicon host to deform elastically so that the silicon is stressed, but remains a substantially defect free perfect crystal. Defects can cause a decrease or relief of the stress. The stress inducing material can be, for example, monocrystalline silicon germanium (SiGe) having about 10-25 atomic percent germanium with the germanium replacing silicon at crystal lattice sites or monocrystalline silicon carbon containing about 1-4 atomic percent of carbon with the carbon replacing silicon at crystal lattice sites. Preferably the stress inducing material is epitaxially grown by a selective growth process. Methods for epitaxially growing these materials on a silicon host in a selective manner are will known and need not be described herein. In the case of SiGe, for example, the SiGe has a greater lattice constant than silicon and creates a compressive longitudinal stress in transistor channel 68. The compressive longitudinal stress increases the mobility of holes in the channel and hence improves the performance of a P-channel MOS transistor.

In accordance with an embodiment of the invention, as the stress inducing material is being grown to fill trenches 82 and 84, the same stress inducing material 90 is being grown on the remaining polycrystalline silicon in thinned, unetched portion 85 of the polycrystalline silicon gate electrode and on the thinned, unetched portion of the polycrystalline silicon gate electrode extension. The mismatch in lattice constant for material 90 and the polycrystalline silicon upon which it is grown is the same as the lattice mismatch between the monocrystalline silicon substrate and material layer 90. At small gate sizes, which are used in high performance MOSFETS, the width of the gate electrode is of the same order of magnitude as the width of a polycrystalline silicon grain. Accordingly, the polycrystalline silicon gate can be represented by a single grain or, at most by a few grains. On the scale of a gate, the material forming the gate is almost monocrystalline, although of arbitrary orientation. Material such as SiGe that grows epitaxially on substrate 36 in trenches 82 and 84 will also grow epitaxially on the thinned polycrystalline silicon forming the gate electrode and the gate electrode extension. The mismatch in lattice constants between material layer 90 and the underlying polycrystalline silicon upon which it is grown causes a tensile transverse stress in channel 68 underlying the gate electrode. A tensile transverse stress in the channel increases the mobility of both holes and electrons in the channel. Accordingly, the growth of the stress inducing material on the gate electrode polycrystalline silicon, which causes a tensile transverse stress, improves the performance of both P-channel MOS transistors and N-channel MOS transistors. The improvement in performance of an N-channel MOS transistor may be sufficient to offset the decrease in electron mobility caused by the compressive longitudinal stress created by the stress inducing material grown in the trenches at the ends of the transistor channel.

Figure 7:
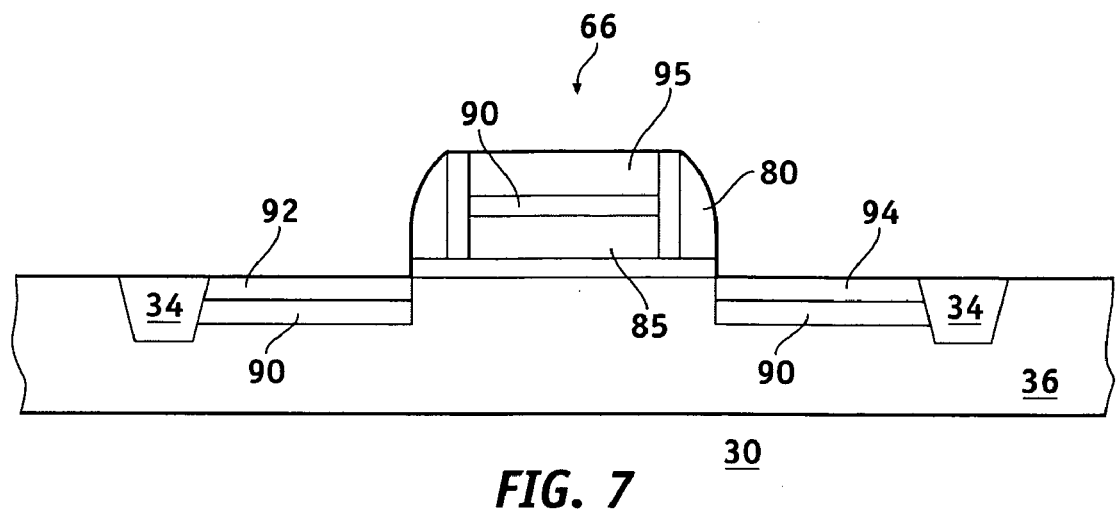

Stress inducing material in trenches 82 and 84 and on the polycrystalline silicon of the gate electrode and the gate electrode extension is doped with conductivity determining impurities to form a source region 92 and a drain region 94 of the stressed MOS transistor as illustrated in FIG. 7. In addition to doping the source and drain regions, the conductivity determining impurities form a doped region 95 in stress inducing material 90 grown on the thinned polycrystalline silicon to reduce the resistivity of the gate electrode and gate electrode extension to facilitate their use as an interconnects for connecting the gate to other circuit elements as required by the circuit being implemented. The doping with conductivity determining impurities may be done in-situ as the stress inducing material is being grown and/or following the growth. The doping can be done following the growth, for example, by ion implantation.

Stressed MOS device 30 can be completed by well known steps (not illustrated) such as depositing a layer of dielectric material, etching opening through the dielectric material to expose portions of the source and drain regions, and forming metallization that extends through the openings to electrically contact the source and drain regions and gate electrode extension, as necessary. Further layers of interlayer dielectric material, additional layers of interconnect metallization, and the like may also be applied and patterned to achiever the proper circuit function of the integrated circuit being implemented.

Figure 8:
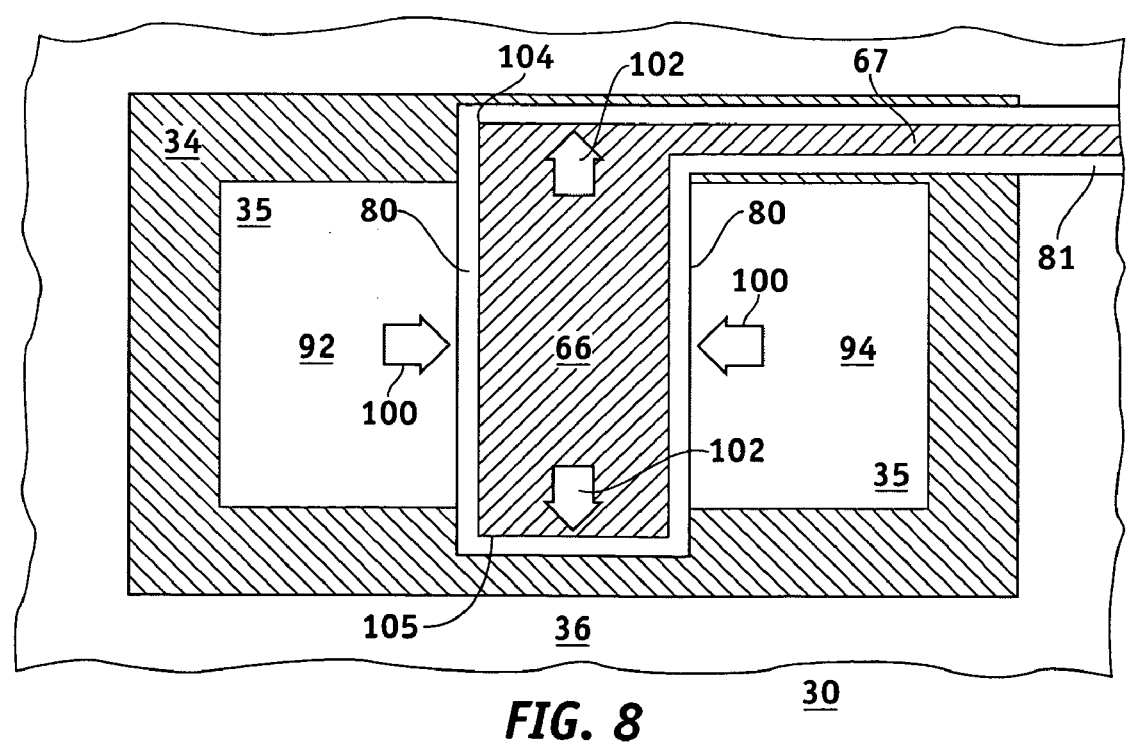

FIG. 8 illustrates, again in top view, stressed MOS device 30 before the contact openings and contact metallization are formed. FIG. 8 illustrates the stresses that are applied to channel 68 of the device which is located beneath gate electrode 66. Illustrated in this figure is shallow trench isolation 34 defining an active area 35. Formed overlying the active area is an MOS transistor gate electrode 66. A gate electrode extension 67 extending angularly from the gate electrode is positioned over a portion of STI 34. Sidewall spacers 80 are formed on opposing sidewalls of gate electrode 66 and sidewall spacers 81 are formed on opposing sidewalls of gate electrode extension 67. A source region 92 and a drain region 94 are formed in active area 35 on opposite sides of gate electrode 66. Although not seen in this top view, a layer of stress inducing material is grown in trenches 82 and 84 etched into the active area and spaced apart from gate electrode 66 by sidewall spacers 80, and on the thinned polycrystalline silicon that forms gate electrode 66 and gate electrode extension 67. A compressive longitudinal stress indicated by arrows 100 is applied to the channel of MOS transistor 30, located in the semiconductor substrate underlying gate electrode 66, by the lattice mismatch between the stress inducing material that is grown in trenches 82 and 84 and the underlying silicon substrate. A tensile transverse stress indicated by arrows 102 is applied to the channel of the MOS transistor as a result of the mismatch in lattice parameters between the polycrystalline silicon forming the gate electrode and the gate electrode extensions and the stress inducing material grown on that polycrystalline silicon. The tensile transverse stress in the channel applied by the stress inducing material grown on the gate electrode polycrystalline silicon becomes greater if, in the direction transverse to the channel, the gate electrode is terminated at an edge or edges of the active area. For example, such a termination may be accomplished by forming a corner, indicated at 104 in FIG. 8. By such a termination the stress in the channel initiated by the stress inducing material grown on the gate electrode polycrystalline silicon is enhanced in the direction indicated by arrows 102. The gate electrode may also be terminated merely by ending at the edge of the active area as indicated at 105. Even in the absence of such a termination, and if gate electrode 66 continued in a straight line for a distance across the shallow trench isolation, the stress from the stress inducing material grown on the gate electrode polycrystalline silicon would still be efficiently redistributed into the MOSFET channel area.

In accordance with a further embodiment of the invention (not illustrated), a method for fabricating a CMOS device structure includes steps of providing embedded epitaxial regions of stress inducing material 90 on opposite sides of the gate electrode structure of only the P-channel MOS transistors. N-channel transistors are suitably masked during the etching step that forms trenches 82 and 84 so that these trenches are formed only on the P-channel transistor. Growing the stress inducing material in the source and drain regions of only the P-channel MOS transistors provides a longitudinal compressive stress applied to the channel region that enhances the hole mobility of those transistors without simultaneously decreasing the mobility of the majority carriers of the N-channel MOS transistors. In accordance with this embodiment of the invention, however, a layer of stress inducing material 90 is grown on the gate electrodes 66 of both the P-channel transistors and the N-channel transistors to apply a tensile transverse stress to the channels of both types of transistors to enhance the mobility of both holes in the channels of the P-channel transistors and electrons in the channels of the N-channel transistors.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stressed MOS transistor comprising the steps of:
   providing a substrate of a monocrystalline semiconductor material having a first lattice constant;
   forming a conductive gate electrode overlying the substrate and a gate electrode extension angularly extending from the gate electrode, the gate electrode having opposing sides and having a thickness and defining a channel in the monocrystalline semiconductor material underlying the gate electrode;
   forming sidewall spacers on the opposing sides of the gate electrode and on the gate electrode extension;
   etching trenches in the semiconductor substrate in alignment with the sidewall spacers and simultaneously etching a portion of the thickness of the conductive gate electrode and the gate electrode extension leaving a remaining portion of the conductive gate electrode and a remaining portion of the gate electrode extension; and
   selectively growing a stress inducing layer of material on the remaining portion of the conductive gate electrode and on the remaining portion of the gate electrode extension, and filling the trenches, the stress inducing layer of material having a second lattice constant different than the first lattice constant, wherein a first lattice mismatch in lattice parameters between the stress inducing layer of material that is grown in trenches and the underlying monocrystalline semiconductor material causes compressive longitudinal stress to be applied to the channel, and wherein a second lattice mismatch in lattice parameters between (a) the gate electrode and the gate electrode extension and (b) the stress inducing layer of material that is grown on the gate electrode and the gate electrode extension causes a tensile transverse stress to be applied to the channel; and
   simultaneously doping the gate electrode the gate electrode extension, and the stress inducing layer of material that is grown in trenches with conductivity determining impurities.

2. The method of claim 1 wherein the step of providing a substrate comprises the step of providing a substrate comprising silicon and wherein the step of selectively growing comprises the step of selectively growing a stress inducing layer comprising a material selected from the group consisting of silicon germanium and silicon carbon.

3. The method of claim 1 wherein the step of forming a conductive gate electrode and a gate electrode extension angularly extending from the gate electrode comprises the step forming a polycrystalline silicon gate electrode and forming a polycrystalline silicon gate electrode extension angularly extending from the polycrystalline silicon gate electrode and wherein the step of selectively growing comprises the step of selectively growing a layer of SiGe on the remaining portion of the polycrystalline silicon gate electrode and the remaining portion of the polycrystalline silicon gate electrode extension.

4. A method for fabricating a stressed MOS transistor comprising the steps of:
   providing a substrate of a monocrystalline semiconductor material having a first lattice constant;
   forming an isolation region defining and surrounding an active region in the substrate;
   forming a gate insulator on the active region;
   depositing a layer of polycrystalline silicon overlying the gate insulator and the isolation region;
   patterning the layer of polycrystalline silicon to form a polycrystalline silicon gate electrode overlying the active region and a polycrystalline silicon gate electrode extension overlying the isolation region, the polycrystalline silicon gate electrode defining a channel in the monocrystalline semiconductor material underlying the polycrystalline silicon gate electrode, the gate electrode extension angularly extending from the gate electrode;
   forming sidewall spacers on the polycrystalline silicon gate electrode and on the polycrystalline silicon gate electrode extension;
   etching trenches extending into the active region in alignment with the sidewall spacers and simultaneously etching a portion of the polycrystalline silicon gate electrode and the polycrystalline silicon gate electrode extension to thin the polycrystalline silicon and to leave an unetched portion of the polycrystalline silicon gate electrode and an unetched portion of the polycrystalline silicon gate electrode extension; and
   selectively growing a layer comprising germanium and silicon in the trenches and on the unetched portion of the polycrystalline silicon gate electrode and on the unetched portion of the polycrystalline silicon gate electrode extension, wherein a first lattice mismatch in lattice parameters between the layer of silicon and germanium that is grown in trenches and the underlying monocrystalline semiconductor material causes compressive longitudinal stress to be applied to the channel, and wherein a second lattice mismatch in lattice parameters between (a) the polycrystalline silicon gate electrode and the polycrystalline silicon gate electrode extension, and (b) the layer of silicon and germanium that is grown on the polycrystalline silicon gate electrode and the polycrystalline silicon gate electrode extension causes a tensile transverse stress to be applied to the channel; and
   doping the polycrystalline silicon of the polycrystalline silicon gate electrode and the polycrystalline silicon gate electrode extension with conductivity determining impurities.

5. The method of claim 4 wherein the step of patterning the layer of polycrystalline silicon comprises the step of patterning the layer of polycrystalline silicon to form a gate electrode extension angularly extending from the gate electrode and forming an angle between the gate electrode extension and the gate electrode of between about 45° and 135°.

6. The method of claim 4 wherein the step of patterning the layer of polycrystalline silicon comprises the step of patterning the layer of polycrystalline silicon to form a gate electrode extension angularly extending from the gate electrode and forming an angle between the gate electrode extension and the gate electrode of about 90°.

7. The method of claim 4 wherein the step of patterning the layer of polycrystalline silicon comprises the step of patterning the layer of polycrystalline silicon to form a termination of the gate electrode at an edge of the active region, wherein the termination increases the tensile transverse stress applied to the channel by the layer of silicon and germanium that is grown on the polycrystalline silicon gate electrode and the polycrystalline silicon gate electrode extension.

* * * * *